(12) United States Patent
Suminoe

(10) Patent No.: US 7,646,094 B2
(45) Date of Patent: Jan. 12, 2010

(54) SEMICONDUCTOR DEVICE

(75) Inventor: Shinji Suminoe, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 188 days.

(21) Appl. No.: 11/699,077

(22) Filed: Jan. 29, 2007

(65) Prior Publication Data

US 2007/0194418 A1    Aug. 23, 2007

(30) Foreign Application Priority Data

Jan. 31, 2006    (JP) .............................. 2006-023306

(51) Int. Cl.
*H01L 23/02*    (2006.01)
(52) U.S. Cl. ................ 257/737; 257/738; 257/E21.511
(58) Field of Classification Search .............. 257/738, 257/737, 778, E21.511, E23.019
See application file for complete search history.

(56) References Cited

U.S. PATENT DOCUMENTS 4,600,273 A * 7/1986 Ohno ........................ 349/155
5,155,301 A * 10/1992 Mase ........................ 174/88 R
6,906,427 B2 * 6/2005 Tanaka et al. ................ 257/778
7,038,144 B2 * 5/2006 Yasuda et al. ............... 174/260
2006/0226545 A1 * 10/2006 Suminoe et al. ............. 257/738

FOREIGN PATENT DOCUMENTS

| JP | 8-172141 | 7/1996 |
|---|---|---|
| JP | 8-267973 A | 10/1996 |
| JP | 11-284094 | 10/1999 |
| JP | 2001-298111 | 10/2001 |
| JP | 2002-33407 A | 1/2002 |
| JP | 2003-338587 | 11/2003 |
| JP | 2004-006839 | 1/2004 |
| JP | 2004-273401 | 9/2004 |
| WO | 2004/040659 | 5/2004 |

* cited by examiner

*Primary Examiner*—Roy K Potter
(74) *Attorney, Agent, or Firm*—Nixon & Vanderhye P.C.

(57) ABSTRACT

A semiconductor device (10) includes: a substrate (1), including an electrode pad (1*a*); an IC chip (4), mounted on the substrate (1); and an externally connecting terminal (7), formed on the electrode pad (1*a*) and electrically connected with the IC chip (4), the externally connecting terminal (7) including a resin core (7*a*) made of an elastic material and including a metal layer (7*b*) formed outside the resin core (7*a*), thereby providing a semiconductor device having high packaging reliability.

8 Claims, 3 Drawing Sheets

Conventional Semiconductor Device

SEMICONDUCTOR DEVICE

This non-provisional application claims priority under 35 U.S.C. § 119(a) on Patent Application No. 023306/2006 filed in Japan on Jan. 31, 2006, the entire contents of which are hereby incorporated by reference.

FIELD OF THE INVENTION

The present invention relates to a semiconductor device mounted on an electronic apparatus.

BACKGROUND OF THE INVENTION

Recently, imaging elements are getting more widely used, not only in mobile apparatuses such as digital cameras and mobile phones, but also in monitoring apparatuses and onboard apparatuses. Besides, IC chips including imaging elements are getting to have larger number of pixels. Under such circumstances, semiconductor devices (packages) are required to have high packaging accuracy and high packaging reliability as well as to be small and light.

An example of semiconductor devices including imaging elements is a package for an optical semiconductor element disclosed in Japanese Unexamined Patent Publication No. 33407/2002 (Tokukai 2002-33407; published on Jan. 31, 2002). The following shortly explains a structure of a conventional semiconductor device with reference to FIG. 5. FIG. 5 is a cross sectional drawing for illustrating a structure of a conventional semiconductor device 40.

In the semiconductor device 40, an IC chip 44 having an optical function, such as an imaging element, is bonded with a substrate 41 via a die-bonding member 43. A wire 45 extends from an electrode pad 44a of the IC chip 44, and is electrically connected with an externally connecting terminal 47 via an electrode pad 41a of the substrate 41.

Further, because the IC chip 44 includes an optical element such as an imaging element, a lid member 46 including a glass window which transmits light is provided above the IC chip 44. This package is connected with a mounting substrate 48 via the externally connecting terminal 47 made of solder or the like.

However, the conventional structure as explained above has the following problems.

In a semiconductor device which includes a ceramic substrate and in which an IC chip package or similar package is bonded with a mounting substrate, when a temperature around the semiconductor device changes, a stress occurs due to a difference in coefficient of thermal expansion between the ceramic substrate and the mounting substrate. At that time, if the semiconductor device includes a bonding section made of a bonding material, particularly solder, then the stress is applied on the bonding section in the semiconductor device. Consequently, the bonding section may be broken.

Further, in a case where the semiconductor device is used as a member of an apparatus, an external stress or a stress due to shock caused by falling of the apparatus may cause cracks in the bonding section. Consequently, defective electric connection may occur.

As described above, the conventional semiconductor device does not have enough packaging reliability. Therefore, if the semiconductor device is used in an apparatus which may be shocked or which may be placed under circumstances with a great change in temperature, then problems may occur.

Further, in a packaging structure using conventional solder, if packaging height is required to be large for increasing packaging reliability, then it is necessary to increase the amount of solder.

However, with the method, when solder is melted on the mounting substrate, the shape of the solder changes. Therefore, as the amount of solder becomes larger, it gets more and more difficult to control the shape of solder. Consequently, as the amount of solder becomes larger, positional accuracy or height accuracy drops in packaging. Further, packaging reliability is not expected to increase greatly.

SUMMARY OF THE INVENTION

An object of the present invention is to provide a semiconductor device having high packaging reliability.

In order to achieve the foregoing object, a semiconductor device of the present invention includes: a substrate, including an electrode pad; a semiconductor element, mounted on the substrate; and one or more externally connecting terminals, formed on the electrode pad and electrically connected with the semiconductor element, each of said one or more externally connecting terminals including a core made of an elastic material and including a metal layer formed outside the core.

With the arrangement, each of said one or more externally connecting terminals includes the metal layer formed outside the core and the semiconductor element mounted on the substrate is electrically connected with said one or more externally connecting terminals formed on the electrode pad. Therefore, if said one or more externally connecting terminals are connected with a mounting substrate, then the semiconductor element is electrically connected with the mounting substrate.

In a conventional semiconductor device including an externally connecting terminal made of solder, a stress applied on the semiconductor device is concentrated on the externally connecting terminal which is a bonding section between the semiconductor device and a mounting substrate. Consequently, the externally connecting terminal may be broken.

On the other hand, the externally connecting terminal of the semiconductor device of the present invention includes a core made of an elastic material, so that the externally connecting terminal can effectively buffer the stress. This allows for a semiconductor device having higher packaging reliability than that of a conventional semiconductor device.

Note that, having higher packaging reliability means that a semiconductor device is mounted on a mounting substrate stably and continuously. To be specific, having higher packaging reliability means that: even when a stress due to a difference in coefficient of thermal expansion between a mounting substrate and a semiconductor device to be mounted is caused by a temperature change in a usage environment, or even when a stress due to bending, shock, or the like is applied from outside, there is little possibility that a bonding section (externally connecting terminal) between the mounting substrate and the semiconductor device is broken by the stress.

For a fuller understanding of the nature and advantages of the invention, reference should be made to the ensuing detailed description taken in conjunction with the accompanying drawings.

DESCRIPTION OF THE EMBODIMENTS

Embodiment 1

Figure 1:
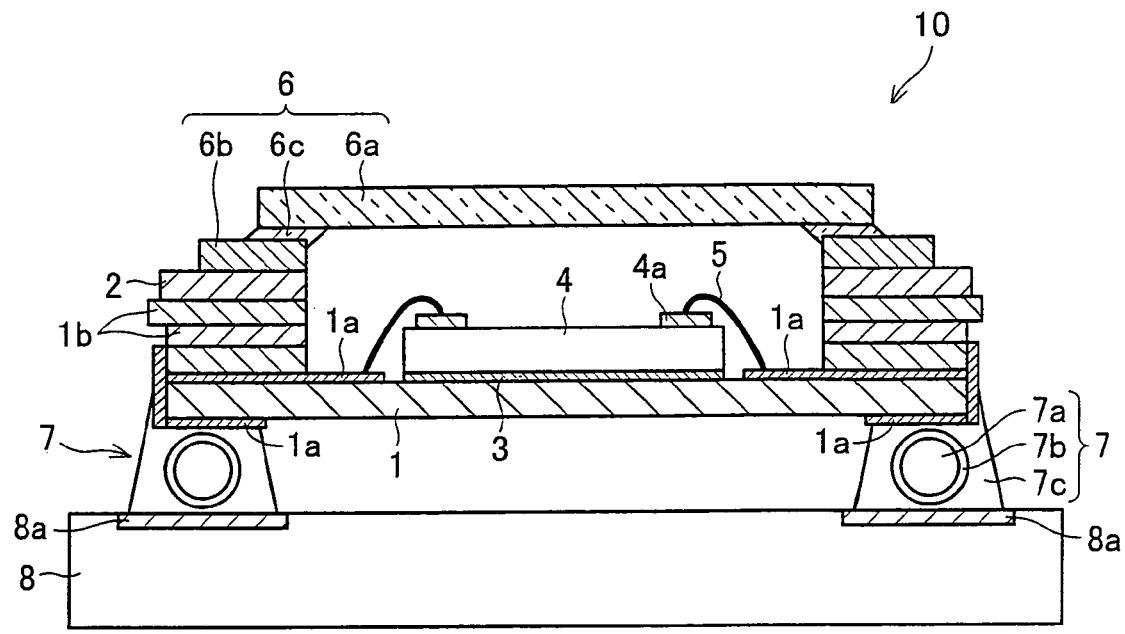
FIG. 1 is a cross sectional drawing for illustrating a structure of a semiconductor device of an embodiment of the present invention.

The following explains an embodiment of the present invention with reference to FIG. 1. FIG. 1 is a cross sectional drawing for illustrating a structure of a semiconductor device 10 of the present embodiment.

As illustrated in FIG. 1, the semiconductor device 10 includes: a substrate 1; an IC chip 4 (semiconductor element) mounted on an upper surface of the substrate 1; a lid member 6 for protecting the IC chip 4; and an externally connecting terminal (external output terminal) 7 provided on a lower surface of the substrate 1 (a surface opposite to the surface on which the IC chip 4 is mounted). In the present embodiment, the semiconductor device 10 is mounted on a mounting substrate 8.

The substrate 1 is a ceramic substrate made of an electrically insulating material such as an aluminum oxide sinter, a mullite sinter, an aluminum nitride sinter, a silicon nitride sinter, and a silicon carbide sinter. Metal wiring (not shown) is formed on the upper surface of the substrate 1.

The substrate 1 includes an electrode pad 1a allowing for an electrical connection between the upper surface and the lower surface of the substrate 1 and a side wall 1b provided on an end section (peripheral section) of the upper surface.

The side wall 1b is a part of the substrate 1 and extends upward on the upper surface of the substrate 1 (extends in a direction away from the mounting substrate 8). A metal ring 2 is provided on a surface constituted by an end of the extended side wall 1b. The metal ring 2 is bonded with an upper surface of the side wall 1b via a silver wax material for example.

The IC chip 4 includes an imaging element (optical element, not shown). The IC chip 4 is mounted on the upper surface of the substrate 1 via a die-bonding material 3 so that the imaging element faces upward. An electrode pad 4a of the IC chip 4 is electrically connected with an electrode pad 1a of the substrate 1 via a metal thin wire 5.

The IC chip 4 may be arranged so that the IC chip 4 is electrically connected with the electrode pad 1a via a member other than the metal thin wire 5. For example, a penetrating electrode is provided in the IC chip 4 and the electrode pad 4a is connected with the electrode pad 1a via the penetrating electrode. Further, other IC chip(s) may be laminated under the IC chip 4.

Further, the type of the imaging element (optical element) is not particularly limited. The imaging element may be a CCD sensor (Charge Coupled Device) sensor or may be CMOS (Complementary Metal Oxide Semiconductor) sensor.

The lid member 6 includes a glass plate 6a (face plate) having light transmitting characteristics, a metal frame 6b, and a low melting point glass section 6c which connects the glass plate 6a with the metal frame 6b.

The glass plate 6a is provided at least above the imaging element of the IC chip 4. The metal frame 6b is made of Fe—Ni—Co alloy or the like whose coefficient of thermal expansion is close to that of the substrate 1.

The lid member 6 is welded to an upper surface of the metal ring 2 through a seam welding method. That is, a high voltage is applied on an end of the metal frame 6b so as to generate Joule heat, which melts the end section of the metal frame 6b, thereby welding the metal frame 6b to the metal ring 2.

For seam welding, a seam welder manufactured by Nippon Avionics Co., Ltd. for example may be used.

By bonding the substrate 1 having a concave shape and including the side wall 1b with the lid member 6, a hollow structure (airtight space) is formed. The IC chip 4 is positioned inside the hollow structure, and is protected by members constituting the hollow structure.

In other words, the lid member 6 includes: the side wall 1b provided to the side of the IC chip 4; and the glass plate 6a which is a face plate provided above the IC chip 4. At least a part of the face plate is made of a light transmitting material.

For seam welding, the inside of a welder must be filled with nitrogen gas or inert gas atmosphere. Welding is performed in a chamber filled with the inert gas atmosphere, so that the hollow structure is also filled with the nitrogen gas or the inert gas. Further, if a welder in which a chamber for seam welding is provided with a vacuum pump or the like is used, then it is possible to perform welding in a chamber under a reduced pressure (alternatively, in a vacuum). At that time, by adjusting a pressure in the chamber, it is possible to adjust a pressure inside the hollow structure.

The externally connecting terminal 7 is connected with (i) the electrode pad 1a provided on the lower surface of the substrate 1 and (ii) the electrode pad 8a included in the mounting substrate 8.

The externally connecting terminal 7 includes a resin core 7a (core) therein. A metal layer 7b is formed outside the resin core 7a. Further, a solder layer 7c is formed outside the metal layer 7b. That is, the externally connecting terminal 7 includes a plurality of metal layers formed outside the resin core 7a. An outermost layer of the metal layers is the solder layer 7c.

The resin core 7a is preferably made of a material whose Young's modulus (elastic modulus) is not less than 0.5 GPa and not more than 10 GPa. If Young's modulus of the resin core 7a is not less than 0.5 GPa and not more than 10 GPa, then it is possible to effectively buffer a stress on the externally connecting terminal 7 and to greatly reduce a possibility that the metal layer 7b cannot deal with too much deformation of the resin core 7a in buffering the stress and thus the metal layer 7b is broken.

Further, the resin core 7a preferably has a heat-resistance. If the resin core 7a has a heat-resistance, then the resin core 7a does not melt when the externally connecting terminal 7 is bonded with the electrode pad 1a or the electrode pad 8a via heating.

An example of resin core solder including a resin core therein and surrounded by a metal layer is Micropearl SOL manufactured by Sekisui Chemical Co., Ltd. Micropearl SOL includes divinylbenzene crosslinking copolymer as the resin core 7a, includes a Cu layer whose thickness is 5 to 20 μm as the metal layer 7b formed outside the resin core 7a, and includes a solder layer as an outermost layer.

(Effect of Semiconductor Device 10)

The following explains the effect of the semiconductor device 10. The semiconductor device 10 includes the externally connecting terminal 7 having the solder layer 7c formed outside the resin core 7a. For that reason, by melting the solder layer 7c through a conventional and inexpensive method such as reflow soldering or a soldering iron, the semiconductor device 10 is easily mounted by the mounting substrate 8.

Figure 5:
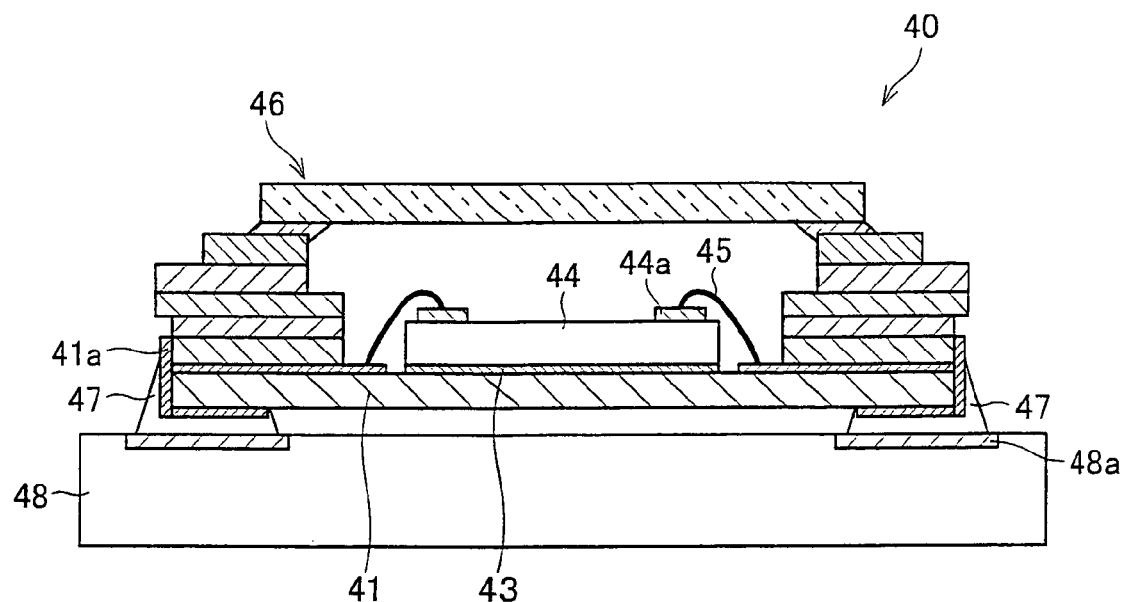
FIG. 5 is a cross sectional drawing for illustrating a structure of a conventional semiconductor device.

As illustrated in FIG. 5, in a case where a semiconductor device 40 is mounted by a mounting substrate 48 via conventional solder as an externally connecting terminal 47, the whole of the externally connecting terminal 47 melts in packaging. Surface tension etc. of the melted externally connecting terminal 47 causes a self-alignment effect in which the externally connecting terminal 47 is caused to align with a land of the mounting substrate 48, so that positional accuracy in packaging can be obtained to some extent. However, the weight of the semiconductor device 40 crushes the externally connecting terminal 47 and thus it is difficult to exactly control a height of the semiconductor device 40. Further, solder is crushed, which causes a problem such as a short-circuit with a neighboring terminal.

On the other hand, the semiconductor device 10 includes the solder layer 7c as an outermost layer of the externally connecting terminal 7, so that it is possible to obtain the same self-alignment effect as that of conventional solder. Further, the resin core 7a in the externally connecting terminal 7 does not melt, so that it is possible to control a height of the semiconductor device 10 with high accuracy. Therefore, even when the height of the externally connecting terminal 7 is made large, unevenness in the height of the semiconductor device 10 rarely occurs. Further, it is possible to reduce a problem such as a short-circuit with a neighboring terminal due to crush of solder.

Further, in a case where reflow packaging cannot be performed because of a low heat-resistance of a semiconductor device or marginal devices and packaging is performed via local heating by a soldering iron or the like, an electrode pad of a mounting substrate is positioned at a peripheral part of the semiconductor device, the electrode pad is heated by the soldering iron or the like, and soldering is performed. At that time, too, the externally connecting terminal 7 of the semiconductor device 10 includes the resin core 7a which does not melt, so that it is possible to control parallelism of the semiconductor device 10 while keeping a certain height of the semiconductor device 10, and to perform packaging with high reliability.

Further, in a case where conventional solder is used as an externally connecting terminal, a bonding section may be broken because a stress due to a difference in coefficient of thermal expansion between a mounting substrate and a semiconductor device is caused by a temperature change, or because a stress due to falling or bending of the mounting substrate and the semiconductor device is caused.

On the other hand, the externally connecting terminal 7 includes the resin core 7a having low elastic modulus, so that it is possible to disperse a stress caused by a temperature change. Further, in the same way, it is possible to disperse a stress due to falling or bending of the mounting substrate and the semiconductor device. Consequently, it is possible to reduce a possibility that a bonding section between the mounting substrate and the semiconductor device is broken.

Therefore, it is possible to realize a semiconductor device which is thin but has high packaging reliability.

Recently, semiconductor devices including imaging elements are widely used as onboard devices. Therefore, there is required a structure allowing a connecting section of an externally connecting terminal to be less likely to be broken due to a temperature change and shock in a packaging state. Further, in semiconductor devices including imaging elements, an optical axis of an imaging element must be set with high accuracy. Therefore, it is required to exactly control an inclination of a semiconductor device with respect to a mounting substrate, that is, to exactly control parallelism of the semiconductor device.

The semiconductor device 10 has high packaging reliability and designing accuracy which meet the above requirements, so that the semiconductor device 10 is preferably used as a semiconductor device including an imaging element.

(Modification Example)

In the above arrangement, the externally connecting terminal 7 is provided at a peripheral part of the substrate 1. Alternatively, the externally connecting terminal 7 may be provided near a central portion of the substrate 1.

Further, in the above arrangement, the side wall 1b is a part of the substrate 1. Alternatively, the metal frame 6b may be arranged so as to have a three-dimensional structure and to have the side wall 1b formed as a part of the metal frame 6b.

Further, the face plate may be made of any material as long as it is a light transmitting material. Thus, the face plate may be made of a light transmitting material other than a glass plate. For example, the face plate may be made of a plastic plate.

Further, in the above arrangement, airtight bonding is realized via seam welding. Alternatively, as is explained in a later-mentioned embodiment, a ceramic substrate having a concave shape is bonded with a glass plate via resin. At that time, whole heating via reflow soldering or the like makes a damage on a bonding section made of resin, and thus it is preferable to bond the externally connecting terminal 7 with the substrate 1 and the mounting substrate 8 via local heating such as a soldering iron.

At that time, it is preferable that the electrode pad 1a of the substrate 1 is provided at the peripheral part of the semiconductor device 10 so that local heating can be performed. At that time, too, the semiconductor device 10 includes the externally connecting terminal 7 including resin which does not melt, so that high packaging reliability can be obtained and a certain height can be maintained. Consequently, it is possible to obtain a desired packaging structure. As a result, it is possible to realize a packaging structure having high optical accuracy, without inclination of the semiconductor device 10. Further, desired packaging reliability can be obtained even when the externally connecting terminal 7 is small in height, so that it is possible to narrow a distance between the semiconductor device 10 and the mounting substrate 8. Consequently, it is possible to realize a thin packaging structure.

Embodiment 2

Figure 2:
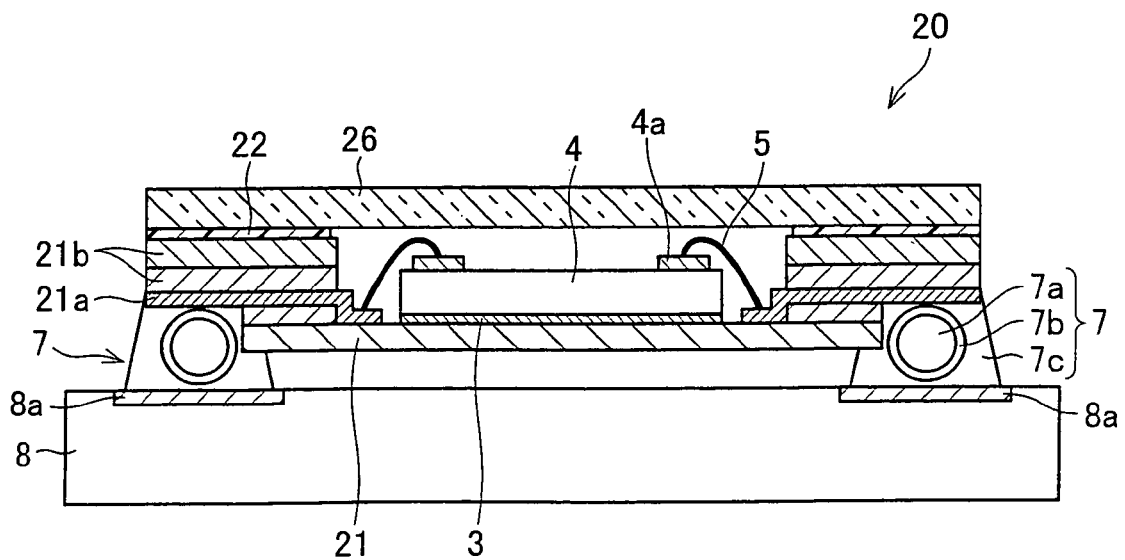
FIG. 2 is a cross sectional drawing for illustrating a structure of a semiconductor device of another embodiment of the present invention.

The following explains another embodiment of the present invention with reference to FIG. 2. Note that, members having the same functions as those of members in Embodiment 1 are given the same reference numerals and explanations thereof will be omitted here. FIG. 2 is a cross sectional drawing for illustrating a structure of a semiconductor device 20 in the present embodiment.

The semiconductor device 20 is different from the semiconductor device 10 in terms of structures of a substrate and a lid member.

As illustrated in FIG. 2, a lower surface of a substrate 21 of the semiconductor device 20 (a surface which faces a mounting substrate 8) includes a concave section. The concave section has a shape which allows an externally connecting terminal 7 to be infixed in the concave section. In FIG. 2, the concave section is provided at a peripheral part of the substrate 21, so that the concave section has a step shape.

An electrode pad 21a is provided on a bottom surface of the concave section, that is, on a surface which has a difference in level with respect to the lower surface of the substrate 21. The electrode pad 21a is electrically connected with an IC chip 4 via a metal thin wire 5.

A side wall 21b of the substrate 21 is provided on the electrode pad 21a. A glass plate 26 (lid member) made of low melting glass is provided on the side wall 21b via resin 22. The side wall 21b is bonded with the glass plate 26 via melting of the resin 22 by heat or via curing of the resin 22 by an ultraviolet ray.

The substrate 21, the side wall 21b, and the glass plate 26 are bonded with one another, so that a hollow structure for protecting the IC chip 4 is formed. In order to keep a width of the resin 22 which width is necessary to prevent water from entering inside the hollow structure and from generating dewfall in a low temperature, or in order to connect an electrode pad 4a of the IC chip 4 with the electrode pad 21a of the substrate 21 via the metal thin wire 5 in the hollow structure, it is generally preferable to arrange the semiconductor device 20 to be larger than the IC chip 4 by 1 mm or more.

(Effect of the Semiconductor Device 20)

In the semiconductor device 20, a concave section (alternatively, a step section) is formed on the lower surface of the substrate 21, the electrode pad 21a is provided on a bottom surface (alternatively, a step surface) of the concave section, and the electrode pad 21a is provided with the externally connecting terminal 7. In other words, in the semiconductor device 20, a part of the externally connecting terminal 7 is contained in the substrate 21. For that reason, it is possible to shorten a distance between the substrate 21 and the mounting substrate 8, so that it is possible to make the semiconductor device thinner.

Consequently, it is possible to provide an externally connecting terminal having a large height while making a semiconductor device thinner, so that it is possible to realize a semiconductor device which is thinner and has higher packaging reliability. Recently, semiconductor devices including optical members such as imaging elements are required to be smaller and thinner as electronic apparatuses become smaller and thinner. The semiconductor device 20 can meet the requirement.

Figure 4:
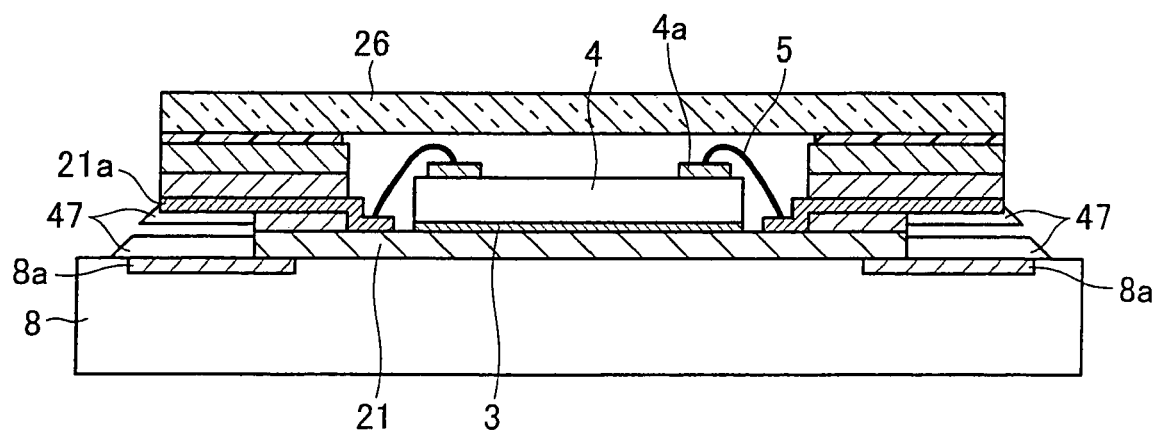
FIG. 4 is a cross sectional drawing for illustrating a state in which a deficient connection is caused due to solder defects in a semiconductor device including an externally connecting terminal made of solder.

In a case where an electrode pad is formed so as to be closer to an IC chip-mounted surface of a substrate than to a lower surface of the substrate and a conventional externally connecting terminal made of solder is provided on the electrode pad, it is necessary to cause a height of the externally connecting terminal to be sufficiently larger than a difference in level between the lower surface of the substrate and the electrode pad. Otherwise, solder bonding often causes defective connection due to solder defects when solder is melted as illustrated in FIG. 4. Consequently, the above structure cannot be realized by a conventional land grid array structure. FIG. 4 is a cross sectional drawing for illustrating a state in which defective connection is caused due to solder defects in a semiconductor device including the externally connecting terminal 47 made of solder.

On the other hand, in a case where the externally connecting terminal 7 including the resin core 7a is used in the semiconductor device 20 in which the electrode pad 21a is formed at the above-mentioned position, the resin core 7a does not melt when solder is melted and the externally connecting terminal 7 is connected with the mounting substrate 8. Consequently, the height of the externally connecting terminal 7 does not become equal to or smaller than that of the resin core 7a. As a result, solder defects as illustrated in FIG. 4 do not occur. In particular, if the height of the resin core 7a is equal to or larger than a difference in level between the lower surface of the substrate and the electrode pad 21a, then it is possible to surely mount the semiconductor device 20.

As described above, even when an electrode pad of an externally connecting terminal is positioned above a lower surface of a substrate, it is possible to surely mount a semiconductor device and to exactly control a height of the externally connecting terminal. Consequently, it is possible to cause the substrate to contain at least a part of the externally connecting terminal and to make the whole semiconductor device thinner.

Embodiment 3

Figure 3:
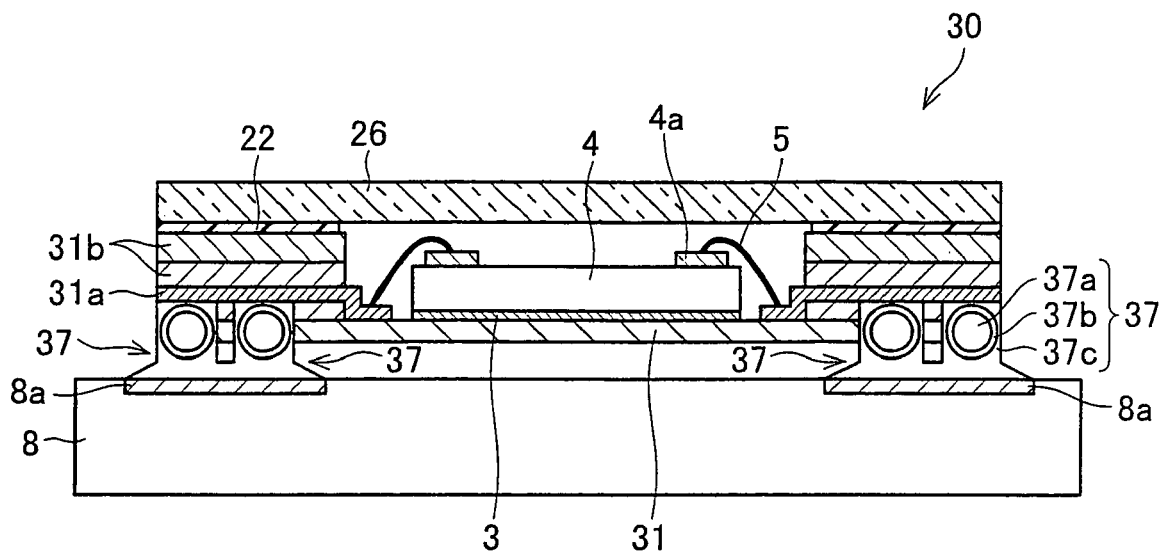
FIG. 3 is a cross sectional drawing for illustrating a structure of a semiconductor device of further another embodiment of the present invention.

The following explains further another embodiment of the present invention with reference to FIG. 3. Note that, members having the same functions as those of members in Embodiments 1 and 2 are given the same reference numerals and explanations thereof will be omitted here. FIG. 3 is a cross sectional drawing for illustrating a structure of a semiconductor device 30 in the present embodiment.

The semiconductor device 30 is different from the semiconductor device 20 in that the semiconductor device 30 includes two externally connecting terminals connected with an electrode pad 8a of a mounting substrate 8.

As illustrated in FIG. 3, two concave sections (alternatively, step sections) are formed at a peripheral part of a substrate 31. An externally connecting terminal 37 smaller than the externally connecting terminal 7 is provided in each concave section (alternatively, step section). In other words, a plurality of externally connecting terminals 37 are formed with respect to each electrode pad 31a of the substrate 31.

With the arrangement, it is possible to make a bonding area of the externally connecting terminals 37 larger without increasing a thickness of the semiconductor device 30. Consequently, it is possible to further increase packaging reliability.

(Modification Example)

In the arrangement, two concave sections (alternatively, step sections) are formed at a peripheral part of the substrate 31 and each externally connecting terminal 37 is provided in each concave section (step section). Alternatively, a plurality of externally connecting terminals 37 are provided in each concave section (alternatively, step section).

Further, the plurality of externally connecting terminals 37 may be completely separated from each other or may be connected with each other at a part thereof.

Further, in the arrangement, the substrate is a ceramic substrate. However, a material of the substrate is not particularly limited to ceramic. The substrate may be an organic substrate. Further, an IC chip is not limited to an IC chip including an imaging element such as a CCD. An IC chip may be an IC chip having other functions.

Further, in the arrangement, an IC chip including an optical element is mounted so as to be opposite to a mounting substrate (face up). Alternatively, the semiconductor device may be arranged so that a mounting substrate includes a light transmitting material such as glass and an IC chip including an optical element faces the mounting substrate (face down).

Further, it is preferable to arrange the semiconductor device so that the core is made of a material whose Young's modulus is not less than 0.5 GPa and not more than 10 GPa.

With the arrangement, the core has Young's modulus (elastic modulus) ranging from 0.5 GPa to 10 GPa. Consequently, it is possible to effectively buffer a stress applied on a semiconductor device and to greatly reduce a possibility that a metal layer cannot deal with too much deformation of the core and thus is broken.

Further, it is preferable to arrange the semiconductor device so that the core has a heat-resistance.

With the arrangement, the core inside the externally connecting terminal does not melt when the externally connecting terminal is bonded with a mounting substrate by heating. Consequently, it is possible to reduce a possibility that the externally connecting terminal is greatly deformed, so that it is possible to keep a certain distance between the semiconductor device and the mounting substrate. Therefore, it is easy to realize a semiconductor device having high positional accuracy and high height accuracy.

Further, it is preferable to arrange the semiconductor device so that the metal layer includes a plurality of layers, and an outermost layer of the layers is a solder layer.

With the arrangement, when a semiconductor device including an externally connecting terminal is subjected to fusion bonding with a mounting substrate via reflow (whole heating), the semiconductor device is bonded with the mounting substrate by melting a solder layer which is the outermost layer of the externally connecting terminal. Consequently, it is possible to adopt a bonding method used for a semiconductor device including a conventional externally connecting terminal made only of solder, and it is possible to obtain a conventional self-alignment effect.

Therefore, it is possible to mount the semiconductor device at a predetermined position on the mounting substrate with high accuracy.

Further, it is preferable to arrange the semiconductor device so that the semiconductor element includes an optical element.

With the arrangement, the semiconductor device can be used as a part of an imaging apparatus. Note that, the optical element may be a light receiving element or an imaging element. The optical element is not particularly limited as long as it can be used as imaging means in an imaging apparatus such as a digital camera.

Further, it is preferable to arrange the semiconductor device so that the semiconductor device further includes a lid member for protecting the semiconductor element.

With the arrangement, the lid member protects the semiconductor element.

Further, it is preferable to arrange the semiconductor device so that the lid member includes (i) side walls respectively provided to sides of the semiconductor element and (ii) a face plate provided above the semiconductor element, and at least a part of the face plate is made of a light transmitting material.

With the arrangement, the semiconductor element is surrounded, so that it is possible to effectively protect the semiconductor element. Further, at least a part of the face plate is made of a light transmitting material, so that it is possible to allow the semiconductor element to serve as an optical element.

Further, it is preferable to arrange the semiconductor device so that the electrode pad on which said one or more externally connecting terminals are formed is formed so as to be closer to a surface of the substrate on which surface the semiconductor element is mounted than to a surface of the substrate opposite to the surface on which the semiconductor element is mounted.

With the arrangement, said one or more externally connecting terminals are provided on the surface opposite to the surface on which the semiconductor element is mounted so that a part of each externally connecting terminal is embedded in the opposite surface. Consequently, it is possible to make the whole semiconductor device thinner. Further, it is possible to make a height of each externally connecting terminal larger while preventing the whole semiconductor device from being thicker.

Further, it is preferable to arrange the semiconductor device so that two or more of the externally connecting terminals are connected with an electrode pad included in a mounting substrate for mounting the semiconductor device.

With the arrangement, a bonding area at which the externally connecting terminals are bonded with the electrode pad can be larger than a bonding area in a case where one externally connecting terminal is connected with one electrode pad in a mounting substrate. Consequently, it is possible to increase packaging reliability of a semiconductor device.

Further, it is preferable to arrange the semiconductor device so that the substrate and the lid member constitute an airtight space.

With the arrangement, it is possible to prevent water from entering into the space from outside. Consequently, it is possible to prevent dewfall disturbing an optical function from being formed on a face plate at a low temperature.

Further, it is preferable to arrange the semiconductor device so that the airtight space is filled with nitrogen gas or inert gas.

With the arrangement, it is possible to put the semiconductor element in nitrogen gas atmosphere or inert gas atmosphere, so that it is possible to prevent an unfavorable reaction such as an oxidizing reaction.

Further, it is preferable to arrange the semiconductor device so that the airtight space has an internal pressure lower than an atmospheric pressure.

With the arrangement, it is possible to prevent such a problem that an internal pressure of the airtight space increases due to exposure at a high temperature in packaging the semiconductor device and the increase breaks a bonding section at which the substrate is bonded with the lid member. Further, the semiconductor device is applicable to a package of MEMS (micro electro mechanical system) which needs a vacuum due to a characteristic of a semiconductor element.

Further, the semiconductor device of the present invention can be expressed as follows. That is, the semiconductor device includes: a substrate including a plurality of electrode pads; an IC chip mounted on the substrate and including an optical element; a lid member for protecting the IC chip; and one or more externally connecting terminals formed on each of the electrode pads included in the substrate, each of said one or more externally connecting terminals including a core matter and a metal layer formed outside the core matter.

Further, it is preferable to arrange the semiconductor device so that the core matter is made of resin, having a heat-resistance and low elasticity, whose Young's modulus is not more than 10 GPa.

Further, it is preferable to arrange the semiconductor device so that the metal layer included in each of said one or more externally connecting terminals includes a plurality of metal layers and an outermost layer of the metal layers is made of solder.

Further, it is preferable to arrange the semiconductor device so that each of the electrode pads is formed so as to be higher than a lowest surface of the substrate.

Further, it is preferable to arrange the semiconductor device so that two or more of the external connecting terminals are provided with respect to an electrode pad of a mounting substrate.

Further, it is preferable to arrange the semiconductor device so that the substrate is a ceramic substrate, side walls are respectively provided at sides of the lid member, and glass is provided on the lid member.

Further, it is preferable to arrange the semiconductor device so that the substrate, the side walls, and the lid member constitute an airtight structure whose inside is hollow.

Further, it is preferable to arrange the semiconductor device so that the airtight structure is filled only with nitrogen gas or inert gas.

Further, it is preferable to arrange the semiconductor device so that the airtight structure has an internal pressure lower than an atmospheric pressure.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a substrate, including an electrode pad;
   a semiconductor element, mounted on the substrate; and
   one or more externally connecting terminals, formed on the electrode pad and electrically connected with the semiconductor element,
   each of said one or more externally connecting terminals including a core made of an elastic material and including a metal layer formed outside the core,
   wherein the electrode pad on which said one or more externally connecting terminals are formed is formed so as to be closer to a surface of the substrate on which surface the semiconductor element is mounted than to a surface of the substrate which surface is opposite to the surface on which the semiconductor element is mounted, and
   wherein the electrode pad on which said one or more externally connecting terminals are formed is formed in a concave section or a step section formed on the surface of the substrate which surface is opposite to the surface on which the semiconductor element is mounted.

2. A semiconductor device, comprising:
   a substrate, including an electrode pad;
   a semiconductor element, mounted on the substrate; and
   one or more externally connecting terminals, formed on the electrode pad and electrically connected with the semiconductor element,
   each of said one or more externally connecting terminals including a core made of an elastic material and including a metal layer formed outside the core,
   wherein two or more of the externally connecting terminals are connected with an electrode pad included in a mounting substrate for mounting the semiconductor device.

3. A semiconductor device, comprising:
   a substrate, including an electrode pad;
   a semiconductor element, mounted on the substrate; and
   one or more externally connecting terminals, formed on the electrode pad and electrically connected with the semiconductor element,
   each of said one or more externally connecting terminals including a core made of an elastic material and including a metal layer formed outside the core, and
   wherein the semiconductor element includes an optical element.

4. The semiconductor device as set forth in claim 3, further comprising a lid member for protecting the semiconductor element.

5. The semiconductor device as set forth in claim 4, wherein
   the lid member includes (i) side walls respectively provided to sides of the semiconductor element and (ii) a face plate provided above the semiconductor element, and
   at least a part of the face plate is made of a light transmitting material.

6. The semiconductor device as set forth in claim 4, wherein the substrate and the lid member constitute an airtight space.

7. The semiconductor device as set forth in claim 6, wherein the airtight space is filled with nitrogen gas or inert gas.

8. The semiconductor device as set forth in claim 7, wherein the airtight space has an internal pressure lower than an atmospheric pressure.

* * * * *